United States Patent [19]

Kawasaki et al.

[11] Patent Number: 4,684,515

[45] Date of Patent: Aug. 4, 1987

[54] SINGLE CRYSTAL ARTICLE

[75] Inventors: Akihisa Kawasaki; Kohji Tada; Toshihiro Kotani, all of Osaka; Shintaro Miyazawa, Isehara, all of Japan

[73] Assignees: Sumitomo Electric Industries, Ltd., Osaka; Nippon Telegraph and Telephone Public Corp., Tokyo, both of Japan

[21] Appl. No.: 727,391

[22] Filed: Apr. 24, 1985

Related U.S. Application Data

[62] Division of Ser. No. 617,563, Jun. 5, 1984, Pat. No. 4,537,652.

[30] Foreign Application Priority Data

Jun. 10, 1983 [JP] Japan ................................ 58-104732

[51] Int. Cl.$^4$ ........................... C01F 1/00; C30B 29/40
[52] U.S. Cl. .................................... 423/495; 423/617; 156/607
[58] Field of Search ......... 156/617 SP, 619, DIG. 70, 156/DIG. 73, DIG. 89, 607; 423/495, 617

[56] References Cited

U.S. PATENT DOCUMENTS

| 3,623,905 | 11/1971 | Akai et al. | 156/619 |
| 3,647,389 | 3/1972 | Welner | 156/DIG. 70 |
| 4,140,570 | 2/1979 | Voltmer et al. | 156/DIG. 73 |
| 4,141,779 | 2/1979 | Hill et al. | 156/617 SP |
| 4,196,171 | 4/1980 | Watanabe et al. | 156/607 |
| 4,528,061 | 7/1985 | Miyazawa et al. | 156/617 SP |

FOREIGN PATENT DOCUMENTS

| 132704 | 10/1978 | Fed. Rep. of Germany | 156/DIG. 73 |
| 134423 | 2/1979 | Fed. Rep. of Germany | 156/DIG. 73 |
| 01016 | 4/1981 | World Int. Prop. O. | |

Primary Examiner—David L. Lacey
Attorney, Agent, or Firm—Wenderoth, Lind & Ponack

[57] ABSTRACT

A single crystal is prepared by drawing up a single crystal by the Czochralski process and cooling it at a temperature not lower than 600° C. in vacuo. In this manner a single crystal having a dislocation density of $1.5 \times 10^4$ cm$^2$ or less is prepared.

2 Claims, 2 Drawing Figures

SINGLE CRYSTAL ARTICLE

This application is a division of application Ser. No. 617,563, filed June 5, 1984, now U.S. Pat. No. 4,537,652.

FIELD OF THE INVENTION

The present invention relates to a process for preparing a single crystal. More particularly, it relates to an improved Czochralski process for preparing a single crystal by pulling up it from a melt raw material.

BACKGROUND OF THE INVENTION

A single crystal is a piece of material which forms one crystal and has a substantially homogeneous atomic sequence throughout the whole piece.

Processes for preparing single crystals can be roughly classified into two groups, namely a solution process and a melt process. The single crystal of a salt is usually prepared by the solution process. However, the solution process is greatly influenced by impurities and/or different kinds of ions while the melt process suffers less from such drawbacks.

As the melt process, there are known several processes including the Kyropoulos process, the Stöber-Stockbarger process, the Verneuli process and the Czochralski process.

The Czochralski process is now briefly explained by making reference to FIG. 1. A surface of a melted raw material 1 is covered with melted $B_2O_3$ 2. A seed crystal 3 contacts the surface of the melted material 1 and pulls up a single crystal 4 with rotation. In FIG. 1, numerals 5 and 6 denote a crucible and a heater respectively.

In order to maintain a stoichiometric composition of a semiconducting compound containing a volatile component, namely an atom having a high vapor pressure (eg. GaP, GaAs, InP, etc.), the whole system is contained in a high-pressure chamber 7 as shown in FIG. 1, which is pressurized to a pressure higher than 2 $Kg/cm^2$ with inert gas 8 (eg. argon, nitrogen, etc.). After grown at the high pressure, the single crystal 4 is cooled to room temperature at the same high pressure and then removed from the chamber 7.

During the cooling at the high pressure, convection flow of the high-pressure gas is so vigorous that the single crystal is quickly cooled, which may result in strain in the crystal and a large dislocation density. For example, the dislocation density in the conventional single crystal is as high as $2-5 \times 10^4$ $cm^{-2}$.

SUMMARY OF THE INVENTION

One object of the invention is to provide a single crystal having a low dislocation density.

Another object of the invention is to provide a process for preparing a single crystal which prevents development of strain in the single crystal and affords a single crystal having a low dislocation density.

These and other objects of the invention can be accomplished by the process of the invention which comprises pulling up a single crystal by the Czochralski process and cooling it at a temperature not lower than 600° C. in vacuo.

DETAILED DESCRIPTION OF THE INVENTION

The process of the invention is suitable to prepare a single crystal of a semiconducting compound containing a volatile component which has been prepared by the Czochralski process. Specific examples of such compound are those consisting of atoms of the groups III–V in the periodic table such as GaP, GaAs and InP, and those consisting of atoms of the groups II–VI in the periodic table such as ZnSe and CdS.

Figure 1:
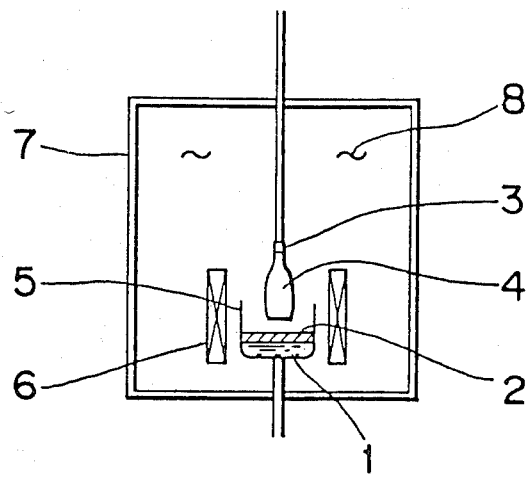
FIG. 1 is a schematic view of an apparatus to be used to carry out the Czochralski process.

Now referring to the figures, FIG. 1 shows the single crystal 4 after being drawn up. The single crystal 4 is pulled up at a high temperature higher than 800° C. (for example, about 1,240° C. in case of GaAs) and a high pressure of 2 to 60 $Kg/cm^2$ and then gradually (at a rate of 0.2 to 4 cm/hr.) pulled up through the layer of melted $B_2O_3$ 2 to the height of about 1 to 10 cm from the surface of the melted $B_2O_3$ 2.

Thereafter, the single crystal is cooled at a rate of up to 5° C./min., e.g., 1° to 2° C./min. while maintaining the same pressure, to a temperature from 800° to 1100° C. (for example about 1,000° C. in case of GaAs) and kept at the same temperature for 1 to 2 hours. The pressure of the inert gas 8 is gradually (at a rate of up to 60 $Kg/cm^2/hr$.) decreased to 1 to 3 $Kg/cm^2$ at the same temperature and kept under the same conditions for 1 to 2 hours.

Then, the single crystal is cooled to a temperature not lower than 600° C. (for example, about 800° C. in case of GaAs) at a rate of up to 5° C./min., e.g., 1° to 2° C./min. while keeping the same pressure. At the same temperature, the interior of the chamber 7 is gradually (at a rate of up to 10 Torr/hr.) evacuated (for example to $10^{-2}$ Torr or lower in case of GaAs), and such vacuum is kept at the same temperature for 1 to 2 hours. After cooling the chamber to room temperature at a rate of 15° C./min., the single crystal 4 is removed from the chamber.

In the process of the invention, the procedures of lowering the pressure and the temperature are not limited to those described above. The essential feature of the invention is cooling the single crystal at a temperature not lower than 600° C. in vacuo. Practically, pressure is preferably lowered by two steps as described above since it is difficult to evacuate the chamber at a relatively high temperature. When the crystal is subjected to low pressure at a temperature lower than 600° C., it is easily cooled and tends to be strained and thus the dislocation density tends to be large.

Since little or no convection of the gas occurs when the single crystal is cooled in vacuo according to the process of the invention, the single crystal is gradually cooled by radiation and, therefore, it is less strained and has a lower dislocation density, for example $1.5 \times 10^4$ $cm^{-2}$ or less, preferably $0.5-1 \times 10^4$ $cm^{-2}$.

The present invention will be hereinafter explained further in detail by following Examples.

EXAMPLES

In the apparatus shown in FIG. 1, a single crystal of semiconducting GaAs was grown by pulling it up at 1238° C. and 15 $Kg/cm^2$ in <100> direction to obtain the single crystal having a diameter of 50 mm and a length of 100 mm.

The thus formed single crystal was gradually (at a rate of 3° C./min.) cooled to about 1,000° C. at 15 Kg/cm$^2$ and then, at the same temperature, the pressure was reduced to 3 Kg/cm$^2$ at a rate of 6 Kg/cm$^2$/hr. and kept at the same pressure for one hour.

Then, the single crystal was cooled to about 800° C. at a rate of 1° to 2° C./min. and at the same temperature, the pressure was gradually (at a rate of 0.1 Kg/cm$^2$/min.) reduced to atmospheric pressure and further gradually (at a rate of 10 Torr/min.) evacuated to 10$^{-2}$ Torr. After being kept at the same temperature and pressure for two hours, the single crystal was cooled to room temperature at a rate of 2° to 3° C./min.

As a comparative example, the formed single crystal was cooled to 800° C. at 15 Kg/cm$^2$ and kept at the same temperature for two hours. Thereafter, the single crystal was cooled to room temperature, at which the pressure was about 7.5 Kg/cm$^2$.

Figure 2:
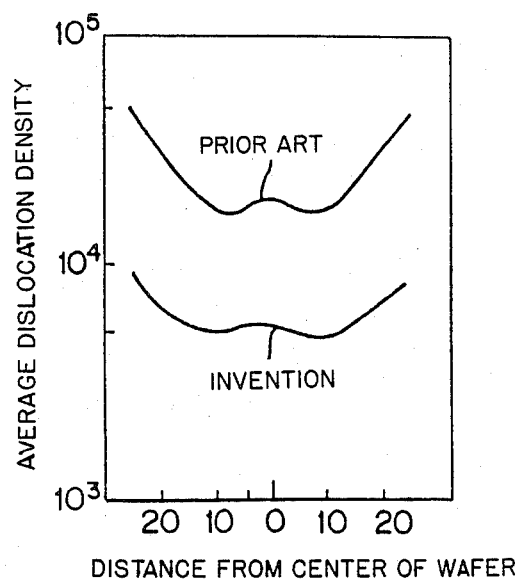
FIG. 2 shows average dislocation densities of the single crystals prepared by the process of the invention and the conventional process.

A wafer of (100) lattice plane was prepared from the front lower part of the each single crystal and etched with a KOH etchant. The obtained etching pitch was observed. The results are shown in FIG. 2. As apparent from FIG. 2, the average dislocation density of the single crystal obtained by the conventional process is 2 to 5×10$^4$ cm$^{-2}$ while the average dislocation density of the one obtained by the process of the invention is 0.5 to 1×10$^4$ cm$^{-2}$ and the scatter is less.

What is claimed is:

1. A single crystal of a compound consisting of atoms of the groups III-V or of atoms of the groups II-IV of the periodic table and having a dislocation density of 1.5×10$^4$ cm$^{-2}$ or less, said crystal being prepared by a process comprising pulling up a single crystal by the Czochralski process and cooling it at a temperature not lower than 600° C. in vacuo wherein the cooling step of the pulled single crystal comprises lowering the temperature at a rate of up to 5° C./min. to a temperature higher than 600° C. while maintaining the same pressure, keeping the same temperature for 1 to 2 hours, reducing the pressure while maintaining the same temperature at a rate of up to 60 Kg/cm$^2$/hr. to 1 to 3 Kg/cm$^2$, keeping the same pressure for 1 to 2 hours, lowering the temperature while maintaining the same pressure at a rate of up to 5° C./min. to a temperature not lower than 600° C., reducing the pressure while maintaining the same temperature at a rate of up to 60 Kg/cm$^2$/hr. to atmospheric pressure, evacuating at a rate of up to 10 Torr/min. to a pressure of 10$^{-2}$ Torr. or lower, and keeping the same vacuum for 1 to 2 hours.

2. A single crystal according to claim 1, having a dislocation density of 0.5–1×10$^4$ cm$^{-2}$.

* * * * *